US009268177B2

(12) United States Patent
Chen et al.

(10) Patent No.: US 9,268,177 B2
(45) Date of Patent: Feb. 23, 2016

(54) LIQUID CRYSTAL DISPLAY PANEL AND PIXEL ELECTRODE STRUCTURE THEREOF

(71) Applicant: INNOLUX CORPORATION, Chu-Nan, Miao-Li County (TW)

(72) Inventors: Chien-Hung Chen, Chu-Nan (TW); Yu-Wei Chen, Chu-Nan (TW); Chuan-Chung Wang, Chu-Nan (TW); Li-Chieh Hsu, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 226 days.

(21) Appl. No.: 13/793,993

(22) Filed: Mar. 11, 2013

(65) Prior Publication Data
US 2013/0265535 A1     Oct. 10, 2013

(30) Foreign Application Priority Data

Apr. 5, 2012  (TW) .............................. 101112114 A (51) Int. Cl.
| G02F 1/1343 | (2006.01) |
| H01L 23/498 | (2006.01) |
| G02F 1/1362 | (2006.01) |
| G02F 1/1337 | (2006.01) |
| G02F 1/137 | (2006.01) |

(52) U.S. Cl.
CPC ...... *G02F 1/134309* (2013.01); *G02F 1/13624* (2013.01); *G02F 1/134363* (2013.01); *H01L 23/498* (2013.01); *G02F 2001/13793* (2013.01); *G02F 2001/133757* (2013.01); *H01L 2924/0002* (2013.01)

(58) Field of Classification Search
CPC .............. G02F 1/134363; G02F 1/134336; G02F 1/133634; G02F 1/134327; G02F 1/134309; G02F 1/13624; H01L 23/498

USPC .......................................................... 349/48
See application file for complete search history.

(56) References Cited

U.S. PATENT DOCUMENTS 8,625,061 B2 * 1/2014 Oh et al. ........................ 349/114
2008/0284929 A1 * 11/2008 Kimura ........................... 349/38
(Continued)

FOREIGN PATENT DOCUMENTS

CN        101783353        7/2010

OTHER PUBLICATIONS

Foreign Office Action issued by the State Intellectual Property Office of the People's Republic of China, dated Apr. 20, 2015.

*Primary Examiner* — Edward Glick
*Assistant Examiner* — Anthony G Quash
(74) *Attorney, Agent, or Firm* — Liu & Liu (57) ABSTRACT

A pixel electrode structure including a first electrode and a second electrode is provided. The first electrode has a first stripe electrode extended along a first direction and pleural first branch electrodes connected to the first strip electrode. The first branch electrodes include pleural first branch domain electrodes extended along a second direction and pleural second branch domain electrodes extended along a third direction substantially perpendicular to the second direction. The second electrode has a second stripe electrode extended along the first direction and pleural second branch electrodes connected to the second stripe electrode. The second branch electrodes include pleural third branch domain electrodes extended along the second direction and pleural fourth branch domain electrodes extended along the third direction. The first and the third branch domain electrodes are alternated to each other. The second and the fourth branch domain electrodes are alternated to each other.

16 Claims, 5 Drawing Sheets

(56) References Cited

U.S. PATENT DOCUMENTS

| | | |
|---|---|---|
| 2010/0156874 A1 * | 6/2010 | Jung et al. .................... 345/211 |
| 2010/0182522 A1 * | 7/2010 | Woo et al. ...................... 349/37 |
| 2010/0296015 A1 * | 11/2010 | Kim et al. ...................... 349/37 |
| 2011/0222004 A1 * | 9/2011 | Kim .............................. 349/106 |

\* cited by examiner

LIQUID CRYSTAL DISPLAY PANEL AND PIXEL ELECTRODE STRUCTURE THEREOF

This application claims the benefit of Taiwan application Serial No. 101112114, filed Apr. 5, 2012, the subject matter of which is incorporated herein by reference.

BACKGROUND OF THE INVENTION

1. Field of the Invention

The invention relates in general to a liquid crystal display, and more particularly to a multi-domain horizontal alignment (MHA) liquid crystal display panel and a pixel electrode structure thereof.

2. Description of the Related Art

Having the features of low voltage operation, no radiation, light weight and small size, the liquid crystal display (LCD) has gradually replaced the conventional cathode ray tube (CRT) display and become a mainstream product in the display market.

However, the liquid crystal display still encounters some problems such as the viewing angle being too narrow and the liquid crystal response time being too long. Therefore, how to enlarge the viewing angle and shorten the response time are prominent tasks for the industries. Currently, several solutions for wide-viewing angle LCD such as multi-domain vertical alignment (MVA) LCD, in-plane switching (IPS) LCD and fringe field switching (FFS) LCD are already provided. The IPS LCD generates a lateral electric field between the pixel electrode and the common electrode to drive the liquid crystal molecules to twist horizontally. The multi-domain horizontal alignment (MHA) LCD makes the liquid crystal molecules arranged in multiple directions to obtain pleural domains with different polarizing angles to increase the viewing angle of the LCD. Due to the restriction in electrode pattern, the liquid crystal molecules located between two adjacent domains are not driven by the electric field to twist. Consequently, the transmittance in the domain boundary region may easily deteriorate and image contrast is low.

SUMMARY OF THE INVENTION

The invention is directed to a liquid crystal display (LCD) panel and a pixel electrode structure thereof capable of increasing the transmittance in the domain boundary region and accordingly increasing image contrast.

According to an embodiment of the present invention, a pixel electrode structure including a first electrode and a second electrode is provided. The first electrode has a first stripe electrode extended along a first direction and a plurality of first branch electrodes connected to the first strip electrode. The first branch electrodes include a plurality of first branch domain electrodes extended along a second direction and a plurality of second branch domain electrodes extended along a third direction substantially perpendicular to the second direction. In addition, the second electrode has a second stripe electrode extended along the first direction and a plurality of second branch electrodes connected to the second stripe electrode. The second branch electrodes include a plurality of third branch domain electrodes extended along the second direction and a plurality of fourth branch domain electrodes extended along the third direction. The first branch domain electrodes and the third branch domain electrodes are alternated to each other. The second branch domain electrodes and the fourth branch domain electrodes are alternated to each other.

According to another embodiment of the present invention, a LCD panel including an active element array substrate, an opposite substrate and a liquid crystal layer is provided. The opposite substrate is opposite and parallel to the active element array substrate. The liquid crystal layer is disposed between the active element array substrate and the opposite substrate. The active element array substrate has a pixel electrode structure. The pixel electrode structure includes a first electrode and a second electrode. The first electrode has a first stripe electrode extended along a first direction and a plurality of first branch electrodes connected to the first strip electrode. The first branch electrodes include a plurality of first branch domain electrodes extended along a second direction and a plurality of second branch domain electrodes extended along a third direction substantially perpendicular to the second direction. In addition, the second electrode has a second stripe electrode extended along the first direction and a plurality of second branch electrodes connected to the second stripe electrode. The second branch electrodes include a plurality of third branch domain electrodes extended along the second direction and a plurality of fourth branch domain electrodes extended along the third direction. The first branch domain electrodes and the third branch domain electrodes are alternated to each other. The second branch domain electrodes and the fourth branch domain electrodes are alternated to each other.

The above and other aspects of the invention will become better understood with regard to the following detailed description of the preferred but non-limiting embodiment(s). The following description is made with reference to the accompanying drawings.

DETAILED DESCRIPTION OF THE INVENTION

The invention provides a liquid crystal display (LCD) panel and a pixel electrode structure thereof. By changing the electrode pattern in the domain boundary region, the liquid crystal molecules located between two adjacent domains are driven by an electric field to twist, such that more lights pass through domain boundary region and the transmittance of the LCD panel is increased. Let the polarizing directions of the upper polarizer and the lower polarizer of the LCD panel be respectively 0 degree and 90 degrees. Considering the polarizing directions of the polarizers, in the following embodiments, the branch electrodes of the pixel electrode structure respectively are arranged at a predetermined angle (such as 45 and 135 degrees), such that in each domain, the direction of the electric field respectively forms an angle of 45 degrees and an angle of 135 degrees with the polarizing direction of the upper polarizer and the polarizing direction of the lower polarizer, and the transmittance of the LCD panel is thus increased.

A number of embodiments are disclosed below for elaborating the invention. However, the embodiments of the invention are for detailed descriptions only, not for limiting the scope of protection of the invention.

Figure 1:
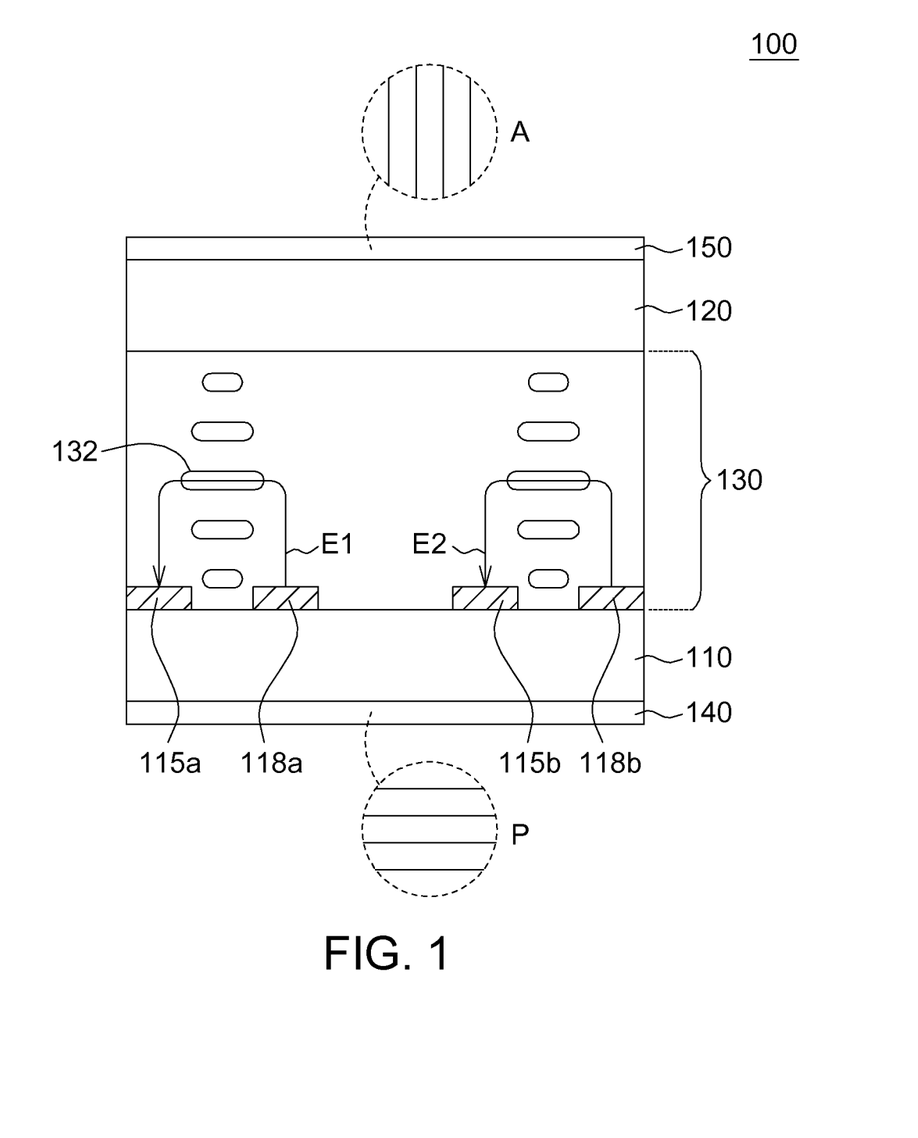
FIG. 1 shows a schematic diagram of a LCD panel according to an embodiment of the invention.

Referring to FIG. 1, a schematic diagram of a LCD panel according to an embodiment of the invention is shown. The LCD panel 100 includes an active element array substrate 110, an opposite substrate 120, a liquid crystal layer 130, a first polarizer 140 and a second polarizer 150. The opposite substrate 120 is opposite and parallel to the active element array substrate 110. For example, the opposite substrate 120 is a color filter substrate, and the active element array substrate 110 is a thin film transistor (TFT) array substrate or a diode array substrate. The liquid crystal layer 130 is disposed between the active element array substrate 110 and the opposite substrate 120, and is realized by a polymer-stabilized blue phase (PSBP) liquid crystal layer or a cholesterol liquid crystal layer. The blue phase liquid crystal has three phases, namely, the first blue phase (BP I), the second blue phase (BP II) and the third blue phase (BP III). The first blue phase liquid crystal and the second blue phase liquid crystal form a double twist cylinder (DTC) structure, that is, double twist cylinders in space are perpendicular to each other. The first blue phase liquid crystal is a body-centered cubic (BCC) structure, the second blue phase liquid crystal is a simple cubic (SC) structure, and the third blue phase liquid crystal is an amorphous structure. When no lateral electric field E is added to the positive type blue phase liquid crystal, ideally the positive blue phase liquid crystal is optical isotropic, has zero variation in the refractive index (that is, $\Delta n=0$), presents a normally black state and is impermeable to the light. When a lateral electric field E is added to the positive type blue phase liquid crystal, the blue phase liquid crystal is optical anisotropic, and its refractive index varies (that is, $\Delta n>0$), such that the light may penetrate the blue phase liquid crystal and present a bright state.

The first polarizer 140 and the second polarizer 150 are respectively disposed on a lower surface of the active element array substrate 110 and an upper surface of the opposite substrate 120, and the polarization axes P and A of the first polarizer (polarizer) 140 and the second polarizer (analyzer) 150 vertically intersect with each other.

First Embodiment

Figure 2:
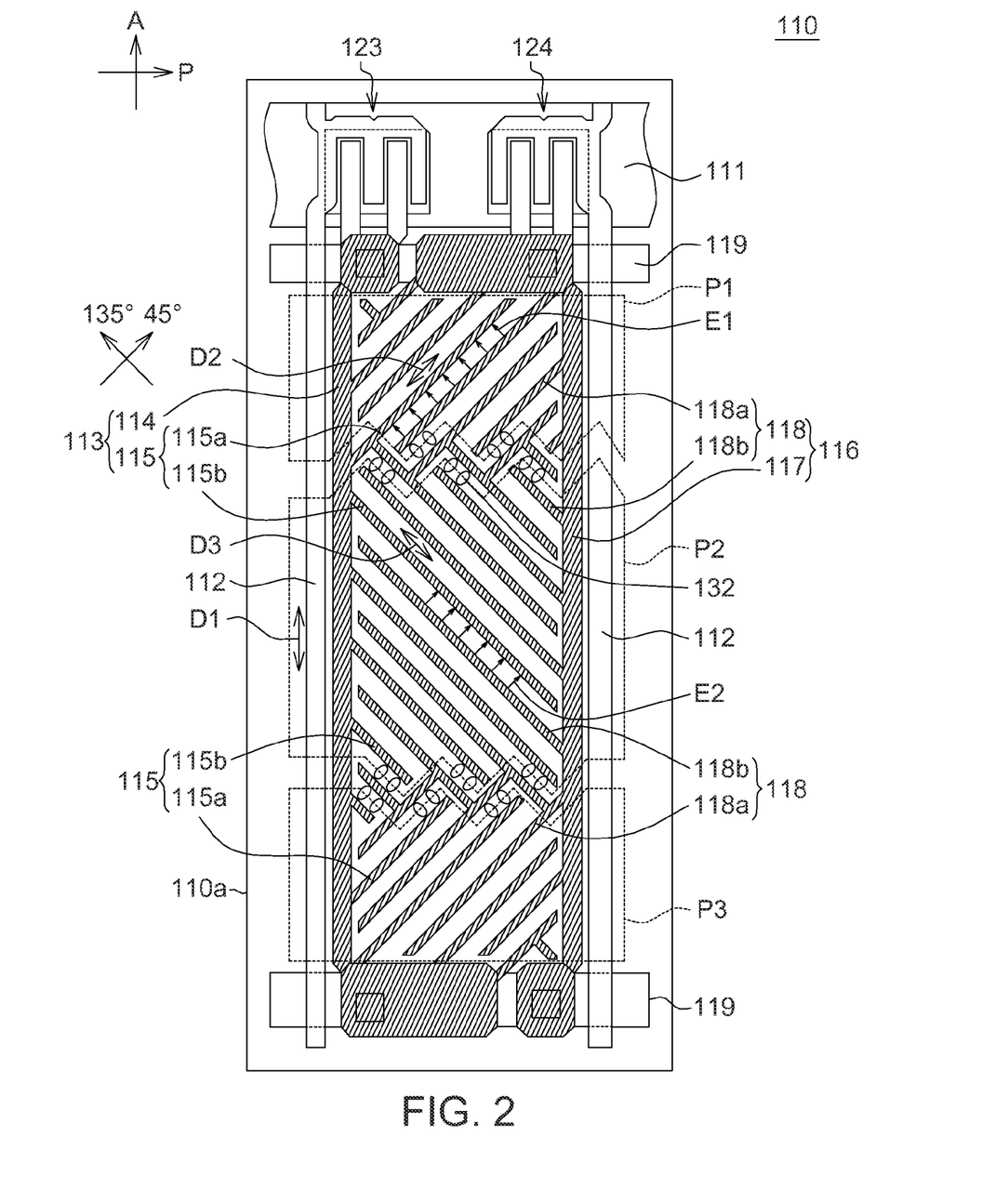
FIG. 2 shows a partial diagram of an active element array substrate according to an embodiment of the invention.

Referring to FIG. 2, a partial diagram of an active element array substrate according to an embodiment of the invention is shown. As indicated in FIG. 2, the active element array substrate 110 has a substrate 110a, a scan line 111, at least one data line 112, a first electrode 113, a second electrode 116, at least one common wire 119 and two active elements 123 and 124. The active element 123 is electrically connected to the scan line 111 and a data line 112. The active element 124 is electrically connected to the scan line 111 and another data line 112. The first electrode 113 and the second electrode 116 are co-planar and located within a pixel region defined by the scan line 111 and two data lines 112, wherein the first electrode 113 and the second electrode 116 are pixel electrodes with different voltages, such that a first electric field E1 and a second electric field E2 are formed between the first electrode 113 and the second electrode 116 for driving the liquid crystal molecules 132 to twist.

In the present embodiment, the first electrode 113 has a first stripe electrode 114 extended along a first direction D1 and a plurality of first branch electrodes 115 connected to the first stripe electrode 114. The first branch electrodes 115 includes a plurality of first branch domain electrodes 115a extended along a second direction D2 and a plurality of second branch domain electrodes 115b extended along a third direction D3. The second direction D2 and the third direction D3 form an angle of 90±10 degrees and preferably the angle is 90 degrees.

In addition, the second electrode 116 has a second stripe electrode 117 extended along the first direction D1 and a plurality of second branch electrodes 118 connected to the second stripe electrode 117. The second branch electrodes 118 includes a plurality of third branch domain electrodes 118a extended along the second direction D2 and a plurality of fourth branch domain electrodes 118b extended along the third direction D3.

In FIG. 2, the first direction D1 is the polarizing direction of the second polarizer (analyzer) 150 of FIG. 1, such that the two data lines 112, the first stripe electrode 114, the second stripe electrode 117 are aligned in the same direction with the polarization axis A of the second polarizer 150. Moreover, the first direction D1 and the second direction D2 substantially form an angle of 45 or 135 degrees, and the first direction D1 and the third direction D3 substantially form an angle of 45 or 135 degrees.

As indicated in FIG. 2, in order to form a multi-domain alignment distribution of electric fields, the pixel region is sequentially divided into a first domain P1, a second domain P2 and a third domain P3, and one domain boundary region is between the first domain P1 and the second domain P2 and another domain boundary region is between the second domain P2 and the third domain P3. For example, a first electric field E1 is formed in the first domain P1 and the third domain P3, and the direction of the first electric field E1 is parallel to the third direction D3 or differs with the third direction D3 by less than 10 degrees. Also, a second electric field E2 is formed in the second domain P2, and the direction of the second electric field E2 is parallel to the second direction D2 or differs with the second direction D2 by less than 10 degrees, for example.

In addition, in domain boundary region between the first domain P1 and the second domain P2, the first branch domain electrodes 115a and the second branch domain electrodes 115b vertically intersect with each other, and are sawtooth-like and extended between the first stripe electrode 114 and the second stripe electrode 117 in the domain boundary region. In domain boundary region between the second domain P2 and the third domain P3, the third branch domain electrodes 118a and the fourth branch domain electrodes 118b vertically intersect with each other in a domain boundary region, and are sawtooth-like and extended between the first stripe electrode 114 and the second stripe electrode 117 in the domain boundary region.

The first branch domain electrodes 115a and the third branch domain electrodes 118a are alternated to each other, and the second branch domain electrodes 115b and the third branch domain electrodes 118b are alternated to each other. When a voltage is applied to the first branch domain electrodes 115a and the third branch domain electrodes 118a, the first branch domain electrodes 115a and the third branch domain electrodes 118a form a first electric field E1 in the first domain P1 and the third domain P3. Likewise, when a voltage is applied to the second branch domain electrodes 115b and the fourth branch domain electrodes 118b, the second branch domain electrodes 115b and the fourth branch domain electrodes 118b form a second electric field E2 in the second domain P2. The rate of penetration is maximized when the angles between the first electric field E1 and the second electric field E2 and the polarization axis A of the second polarizer 150 are equal to 45 degrees and 135 degrees respectively, and the transmittance of the LCD panel 100 can thus be increased. Similarly, the liquid crystal molecules 132 located in two domain boundary region are driven by the first electric field E1 or the second electric field E2 to twist, and the rate of penetration can further be increased.

Second Embodiment

Figure 3:
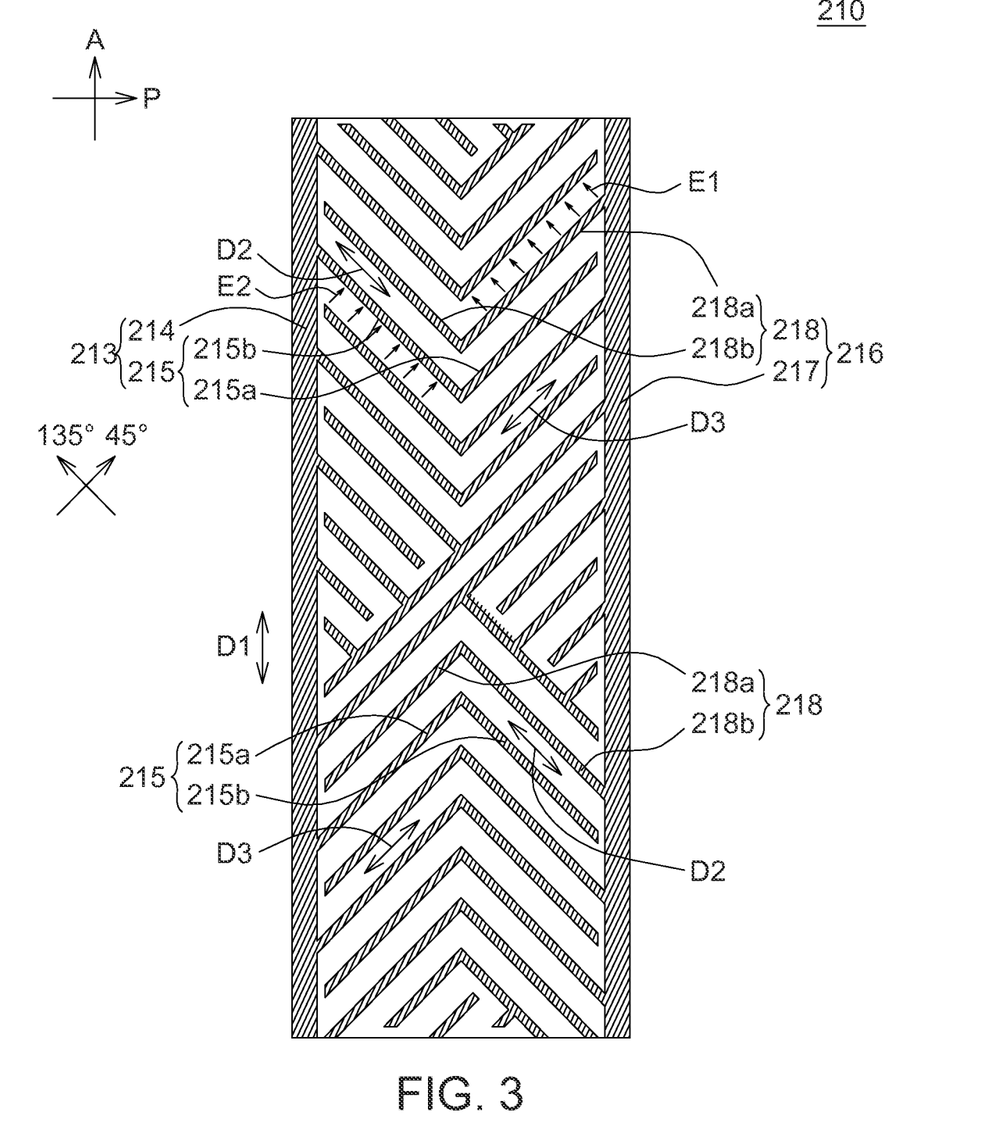
FIG. 3 shows a schematic diagram of a pixel electrode structure according to an embodiment of the invention.

Referring to FIG. 3, a schematic diagram of a pixel electrode structure according to an embodiment of the invention is shown. Like the active element array substrate 110 used in the first embodiment, the pixel electrode structure 210 includes a first electrode 213 and a second electrode 216. The first electrode 213 has a first stripe electrode 214 extended along a first direction D1 and a plurality of first branch electrodes 215 connected to the first stripe electrode 214. The first branch electrodes 215 includes a plurality of first branch domain electrodes 215a extended along a second direction D2 and a plurality of second branch domain electrodes 215b extended along a third direction D3. The second direction D2 and the third direction D3 are substantially perpendicular to each other or the difference is less than 10 degrees. In addition, the second electrode 216 has a second stripe electrode 217 extended along the first direction D1 and a plurality of second branch electrodes 218 connected to the second stripe electrode 217. The second branch electrodes 218 includes a plurality of third branch domain electrodes 218a extended along the second direction D2 and a plurality of fourth branch domain electrodes 218b extended along the third direction D3. The first branch domain electrodes 215a and the third branch domain electrodes 218a are alternated to each other. The second branch domain electrodes 215b and the fourth branch domain electrodes 218b are alternated to each other.

Like the first embodiment, when a voltage is applied to the first branch domain electrodes 215a and the third branch domain electrodes 218a, a first electric field E1 is formed between the first branch domain electrodes 215a and the third branch domain electrodes 218a due to voltage difference. When a voltage is applied to the second branch domain electrodes 215b and the fourth branch domain electrodes 218b, a second electric field E2 is formed between the second branch domain electrodes 215b and the fourth branch domain electrodes 218b due to voltage difference. The rate of penetration is maximized when the angles between the first electric field E1 and the second electric field E2 and the polarization axis A of the second polarizer 150 are equal to 45 degrees and 135 degrees respectively, and the transmittance of the LCD panel can thus be increased.

Third Embodiment

Figure 4:
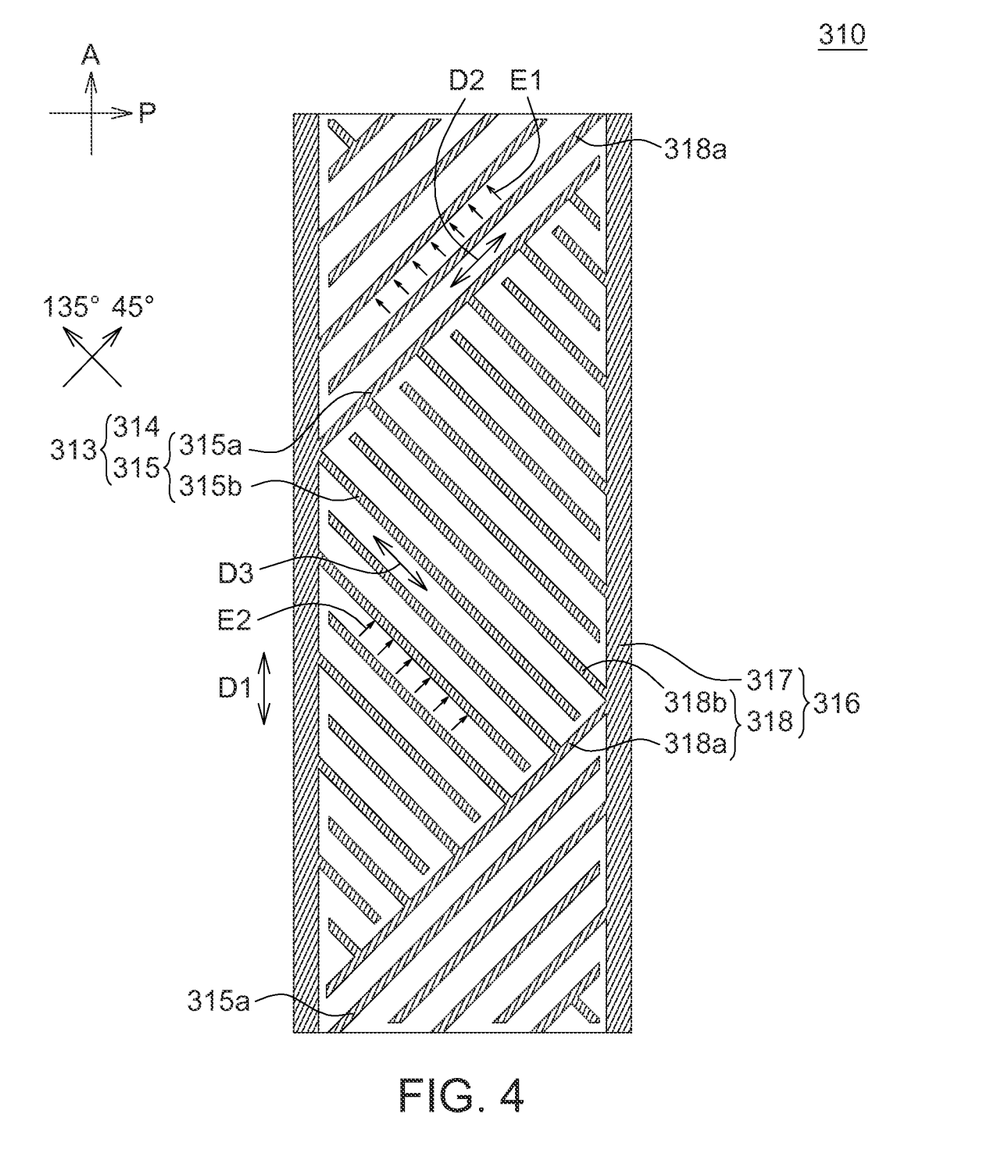
FIG. 4 shows a schematic diagram of a pixel electrode structure according to an embodiment of the invention.

Referring to FIG. 4, a schematic diagram of a pixel electrode structure according to an embodiment of the invention is shown. Like the active element array substrate 110 used in the first embodiment, the pixel electrode structure 310 includes a first electrode 313 and a second electrode 316. The first electrode 313 has a first stripe electrode 314 extended along a first direction D1 and a plurality of first branch electrodes 315 connected to the first stripe electrode 314. The first branch electrodes 315 includes a plurality of first branch domain electrodes 315a extended along a second direction D2 and a plurality of second branch domain electrodes 315b extended along a third direction D3. The second direction D2 and the third direction D3 form an angle of 90±10 degrees, and preferably the angle is 90 degrees. In addition, the second electrode 316 has a second stripe electrode 317 extended along the first direction D1 and a plurality of second branch electrodes 318 connected to the second stripe electrode 317. The second branch electrodes 318 includes a plurality of third branch domain electrodes 318a extended along the second direction D2 and a plurality of fourth branch domain electrodes 318b extended along the third direction D3. The first branch domain electrodes 315a and the third branch domain electrodes 318a are alternated to each other. The second branch domain electrodes 315b and the fourth branch domain electrodes 318b are alternated to each other.

Figure 5:
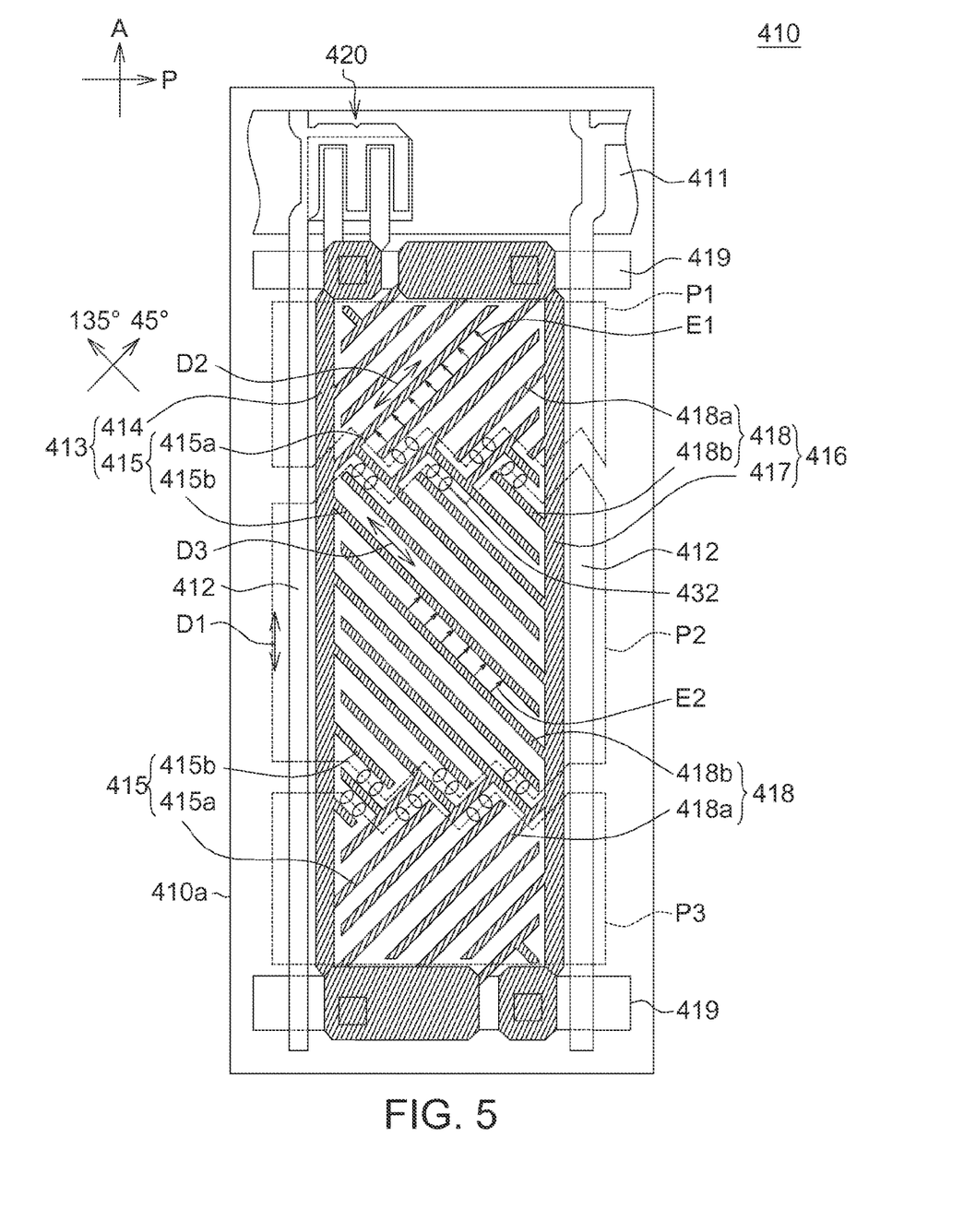
FIG. 5 shows a partial diagram of an active element array substrate according to an embodiment of the invention.

Like the first embodiment, when a voltage is applied to the first branch domain electrodes 315a and the third branch domain electrodes 318a, a first electric field E1 is formed between the first branch domain electrodes 315a and the third branch domain electrodes 318a due to voltage difference. When a voltage is applied to the second branch domain electrodes 315b and the fourth branch domain electrodes 318b, a second electric field E2 is formed between the second branch domain electrodes 315b and the fourth branch domain electrodes 318b due to voltage difference. The rate of penetration is maximized when the angles between the first electric field E1 and the second electric field E2 and the polarization axis A of the second polarizer 150 are equal to 45 degrees and 135 degrees respectively, and the transmittance of the LCD panel can thus be increased Fourth Embodiment Referring to FIG. 5, a partial diagram of an active element array substrate according to an embodiment of the invention is shown. As indicated in FIG. 5, the active element array substrate 410 has a substrate 410a, a scan line 411, at least one data line 412, a first electrode 413, a second electrode 416, at least one common line 419 and an active element 420. The present embodiment is different from the first embodiment in that: the first electrode 413 is a pixel electrode, and the second electrode 416 is a common electrode, for example. The active element 420 is electrically connected to the scan line 411 and the data line 412. The first electrode 413 and the second electrode 416 are co-planar and located within a pixel region defined by the scan line 411 and the data lines 412.

Descriptions and disposition relationships related to the first stripe electrode 414, the first branch electrodes 415, the first branch domain electrodes 415a, the second branch domain electrodes 415b, the second branch electrodes 418, the third branch domain electrodes 418a and the fourth branch domain electrodes 418b are similar to the disclosure in the first embodiment, and the similarities are not repeated here. Moreover, descriptions and disposition relationships of the pixel electrode structures 210 and 310 disclosed in the second embodiment and the third embodiment can also be used in the present embodiment, and the similarities are not repeated here.

When a voltage is applied to the first branch domain electrodes 415a and the third branch domain electrodes 418a, a first electric field E1 is formed between the first branch domain electrodes 415a and the third branch domain electrodes 418a due to voltage difference. When a voltage is applied to the second branch domain electrodes 415b and the fourth branch domain electrodes 418b, a second electric field is formed between the second branch domain electrodes 415b and the fourth branch domain electrodes 418b. The first electric field E1 and the second electric field E2 is realized by an in-plane switching (IPS) lateral electric field or a fringe field switching (FFS) lateral electric field for driving the liquid crystal molecules 432 to twist horizontally to control the rate of penetration of the liquid crystal layer, such that the light may penetrate the liquid crystal layer and present a bright state. The rate of penetration is maximized when the angles between the first electric field E1 and the second electric field E2 and the polarization axis A of the second polarizer 150 are equal to 45 degrees and 135 degrees respectively, and the transmittance of the LCD panel 100 can thus be increased Although lateral electric fields are exemplified in the above embodiments, the pixel electrode structure and the LCD panel of the invention are not limited thereto, and may also be used in vertical electric fields such that the transmittance of the LCD panel can further be increased.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pixel electrode structure located between two data lines extended along a first direction, the pixel electrode structure comprising:
   a first electrode having a first stripe electrode extended along the first direction and a plurality of first branch electrodes connected to the first stripe electrode, wherein the first branch electrodes comprise a plurality of first branch domain electrodes extended along a second direction and a plurality of second branch domain electrodes extended along a third direction substantially perpendicular to the second direction; and
   a second electrode having a second stripe electrode extended along the first direction and a plurality of second branch electrodes connected to the second stripe electrode, wherein the second branch electrodes comprise a plurality of third branch domain electrodes extended along the second direction and a plurality of fourth branch domain electrodes extended along the third direction, the first and the third branch domain electrodes are alternated to each other, and the second and the fourth branch domain electrodes are alternated to each other,
   wherein the first branch domain electrodes in a first domain and the second branch domain electrodes in a second domain vertically intersect with each other in a first domain boundary region between the first domain and the second domain and are sawtooth-like in the first domain boundary region, and the third branch domain electrodes in a third domain and the fourth branch domain electrodes in the second domain vertically intersect with each other in a second domain boundary region between the second domain and the third domain and are sawtooth-like in the second domain boundary region.

2. The pixel electrode structure according to claim 1, wherein the first direction and the second direction substantially form an angle of 45 or 135 degrees.

3. The pixel electrode structure according to claim 1, wherein the first direction and the third direction substantially form an angle of 45 or 135 degrees.

4. The pixel electrode structure according to claim 1, wherein a first electric field is formed between the first and the third branch domain electrodes, and the direction of the first electric field is substantially parallel to the third direction.

5. The pixel electrode structure according to claim 1, wherein a second electric field is formed between the second and the fourth branch domain electrodes, and the direction of the second electric field is substantially parallel to the second direction.

6. The pixel electrode structure according to claim 1, wherein both the first electrode and the second electrode are pixel electrodes.

7. The pixel electrode structure according to claim 1, wherein the first electrode and the second electrode respectively are a pixel electrode and a common electrode.

8. The pixel electrode structure according to claim 1, wherein the first electrode and the second electrode are co-planar.

9. A liquid crystal display (LCD) panel, comprising:
   an active element array substrate having a pixel electrode structure located between two data lines which are extended along a first direction, wherein the pixel electrode structure comprises:
   a first electrode having a first stripe electrode extended along the first direction and a plurality of first branch electrodes connected to the first stripe electrode, wherein the first branch electrodes comprise a plurality of first branch domain electrodes extended along a second direction and a plurality of second branch domain electrodes extended along a third direction substantially perpendicular to the second direction; and
   a second electrode having a second stripe electrode extended along the first direction and a plurality of second branch electrodes connected to the second stripe electrode, wherein the second branch electrodes comprise a plurality of third branch domain electrodes extended along the second direction and a plurality of fourth branch domain electrodes extended along the third direction, the first and the third branch domain electrodes are alternated to each other, and the second and the fourth branch domain electrodes are alternated to each other,
   wherein the first branch domain electrodes in a first domain and the second branch domain electrodes in a second domain vertically intersect with each other in a first domain boundary region between the first domain and the second domain and are sawtooth-like in the first domain boundary region, and the third branch domain electrodes in a third domain and the fourth branch domain electrodes in the second domain vertically intersect with each other in a second domain boundary region between the second domain and the third domain and are sawtooth-like in the second domain boundary region;
   an opposite substrate opposite and parallel to the active element array substrate; and
   a liquid crystal layer disposed between the active element array substrate and the opposite substrate.

10. The LCD panel according to claim 9, wherein the first direction and the second direction substantially form an angle of 45 or 135 degrees.

11. The LCD panel according to claim 9, wherein the first direction and the third direction substantially form an angle of 45 or 135 degrees.

12. The LCD panel according to claim 9, wherein a first electric field is formed between the first and the third branch domain electrodes, and the direction of the first electric field is substantially parallel to the third direction.

13. The LCD panel according to claim 9, wherein a second electric field is formed between the second and the fourth branch domain electrodes, and the direction of the second electric field is substantially parallel to the second direction.

14. The LCD panel according to claim 9, wherein both the first electrode and the second electrode are pixel electrodes.

15. The LCD panel according to claim 9, wherein the first electrode and the second electrode respectively are a pixel electrode and a common electrode.

16. The LCD panel according to claim 9, wherein the first electrode and the second electrode are co-planar.

* * * * *